(12) United States Patent
Rokhsaz

(10) Patent No.: US 6,670,847 B1
(45) Date of Patent: Dec. 30, 2003

(54) INDUCTIVE AMPLIFIER WITH A FEED FORWARD BOOST

(75) Inventor: Shahriar Rokhsaz, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/051,642

(22) Filed: Jan. 18, 2002

(51) Int. Cl.$^7$ .............................................. H03F 3/45
(52) U.S. Cl. ...................... 330/25; 330/252; 330/295; 327/562; 327/563
(58) Field of Search ................................. 330/252, 253, 330/295; 327/560, 561, 562, 563

(56) References Cited

U.S. PATENT DOCUMENTS

| | | | | |
|---|---|---|---|---|
| 4,287,476 A | * | 9/1981 | Cense ........................ | 330/254 |
| 4,388,540 A | * | 6/1983 | Schreurs ..................... | 327/356 |
| 4,695,806 A | * | 9/1987 | Barrett ....................... | 330/254 |
| 5,521,545 A | * | 5/1996 | Terry et al. ................. | 327/359 |
| 5,914,637 A | * | 6/1999 | Kagawa ...................... | 330/254 |
| 6,057,714 A | * | 5/2000 | Andrys et al. ............... | 327/105 |
| 6,201,443 B1 | * | 3/2001 | Tanji .......................... | 330/254 |
| 6,392,486 B1 | * | 5/2002 | Lemay, Jr. ................... | 330/253 |
| 6,404,263 B1 | * | 6/2002 | Wang .......................... | 327/359 |
| 6,429,721 B1 | * | 8/2002 | Armitage et al. ............ | 327/359 |
| 6,446,093 B2 | * | 9/2002 | Tabuchi ....................... | 707/205 |
| 2001/0018334 A1 | * | 8/2001 | Ipek et al. ................... | 455/318 |

* cited by examiner

*Primary Examiner*—Michael Tokar
*Assistant Examiner*—Khai Nguyen
(74) *Attorney, Agent, or Firm*—E. Eric Hoffman

(57) ABSTRACT

An inductive amplifier having a feed forward boost is provided, thereby improving the gain of the inductive amplifier at frequencies greater than 1 GigaHertz. The inductive amplifier includes a feed-forward boost circuit coupled to intermediate nodes of an inductive amplifier circuit, whereby the feed-forward boost circuit generates boost currents that are added to the currents of the inductive amplifier circuit. In one embodiment, the feed-forward boost circuit includes a boost current supply, a first boost transistor coupled between the current supply and a first intermediate node of the inductive amplifier circuit, and a second boost transistor coupled between the current supply and a second intermediate node of the inductive amplifier circuit. In one embodiment, the first and second boost transistors and the inductive amplifier circuit are controlled by the same differential input signals.

4 Claims, 5 Drawing Sheets

INDUCTIVE AMPLIFIER WITH A FEED FORWARD BOOST

FIELD OF THE INVENTION

The present invention relates to an inductive amplifier. More specifically, the present invention relates to an inductive amplifier having a feed-forward boost function.

DESCRIPTION OF RELATED ART

FIG. 1 is a circuit diagram of a conventional inductive amplifier 100, which may operate as an analog front end in a semiconductor chip. Inductive amplifier 100 includes inductors L1–L2, resistances rr1–rr2, capacitors C1–C2, resistors R1–R2, n-channel transistors N1–N2, current source I1, and output nodes $O_N$ and $O_P$. A differential input signal $VI_N$–$VI_P$ is applied to the gates of transistors N1 and N2, respectively. The $VI_N$ and $VI_P$ signals represent the negative and positive phases of the differential input signal, respectively. As described below, inductive amplifier 100 operates to create boosted output signals $VO_P$ and $VO_N$ in response to the input signals $VI_N$ and $VI_P$.

When the $VI_N$ input signal is high relative to the $VI_P$ input signal, then the $VO_P$ output voltage on node $O_P$ is pulled lower than the $VO_N$ output voltage on node $O_N$. Conversely, when the $VI_P$ input signal is high relative to the $VI_N$ input signal, then the $VO_N$ output voltage on node $O_N$ is pulled lower than the $VO_P$ output voltage on node $O_P$. The various elements of inductive amplifier 100 are connected such that the $VO_P$ and $VO_N$ output voltages are amplified with respect to the $VI_P$ and $VI_N$ input voltages.

FIG. 2 is a Bode plot illustrating several typical frequency response curves 201–203 for inductive amplifier 100. The frequency response depends on the values of resistors R1, R2, rr1 and rr2 versus the values of inductors L1 and L2. In the following description of FIG. 2, resistances rr1 and rr2 are considered to be the parasitic resistances of the inductors L1 and L2 on chip. Thus, curves 201, 202 and 203 may represent the frequency response of inductive amplifier 100 when resistors R1 and R2 have resistances of 50, 100 and 300 Ohms, respectively. Note that for curve 201, amplifier 100 exhibits an acceptable gain at frequencies below the 3 db roll-off frequency. However, for frequencies above the 3 db roll-off frequency of curve 201, the gain is too low to enable inductive amplifier 100 to operate properly. Consequently, it may not be possible to use inductive amplifier 100 in communication applications that use high frequencies in the range of 5 GHz or greater.

Also note that as the values of resistors R1 and R2 decrease (i.e., curves 202 and 203), amplifier 100 can exhibit peaking. This inherently reduces the maximum gain of amplifier 100, because this amplifier must be designed within a limited range of resistances R1 and R2.

It would therefore be desirable to have an improved inductive amplifier that exhibits a high gain at relatively high frequencies in the range of 1 GHz or greater.

SUMMARY

Accordingly, the present invention provides a low noise inductive amplifier having a feed-forward boost circuit that boosts the gain of an inductive amplifier circuit at high frequencies. That is, the feed-forward boost path provides an inductive amplifier having an increased bandwidth with respect to conventional amplifiers. In one embodiment, the feed-forward boost circuit adequately boosts the gain of the inductive amplifier to acceptable levels at frequencies greater than 1 GHz. For example, the feed-forward boost circuit can boost the gain of the inductive amplifier to enable operation at 10 Gigabits/second (Gb/sec).

In one embodiment, the feed-forward boost circuit includes a first boost transistor coupled receive a first differential input signal, a second boost transistor coupled to receive a second differential input signal, and a boost current source coupled to sources of both the first and second boost transistors. The drains of the first and second boost transistors are coupled to first and second intermediate output nodes of an inductive amplifier circuit, respectively. In one embodiment, the first and second intermediate output nodes correspond with ends of the load resistors of the inductive amplifier.

The AC current inserted by the feed-forward boost circuit causes the inductive amplifier to exhibit a relatively constant gain from DC (0 Hz) up to the resonant frequency of the entire LC tank circuit formed by the inductive amplifier circuit and the feed-forward boost circuit. Thus, the feed-forward boost circuit extends the range of frequencies at which the inductive amplifier exhibits an acceptable gain. Moreover, by controlling the sizing of the first and second boost transistors and the boost AC current source, the gain amplitude at the resonant frequency can be controlled. Moreover, it is possible to turn off the boost gain provided by feed-forward boost circuit by disabling the boost current source.

Advantageously, it is not necessary to use a negative resistance concept to achieve these results.

The inductive amplifier of the present invention can be used in any product that incorporates multi-gigabit transceivers that operate in the range of 1 Gb/sec and above. For example, the inductive amplifier of the present invention can be used in input sections of receivers in multi-gigabit transceivers, in field programmable gate arrays (FPGAs), or as stand alone parts.

In another embodiment, a loop-back path is provided, such that a signal provided by a transmitter is routed to the output terminals of the inductive amplifier, while the inductive amplifier is disabled. By providing this loop-back path, the transmitted signal can be routed to a bit-error rate monitor, such that bit-error rate of the transmitted signal can be accurately determined. The loop-back path therefore enables the inductive amplifier to be used in serializer/deserializer (SerDes) applications.

The present invention will be more fully understood in view of the following descriptions and drawings.

DETAILED DESCRIPTION

Figure 1:
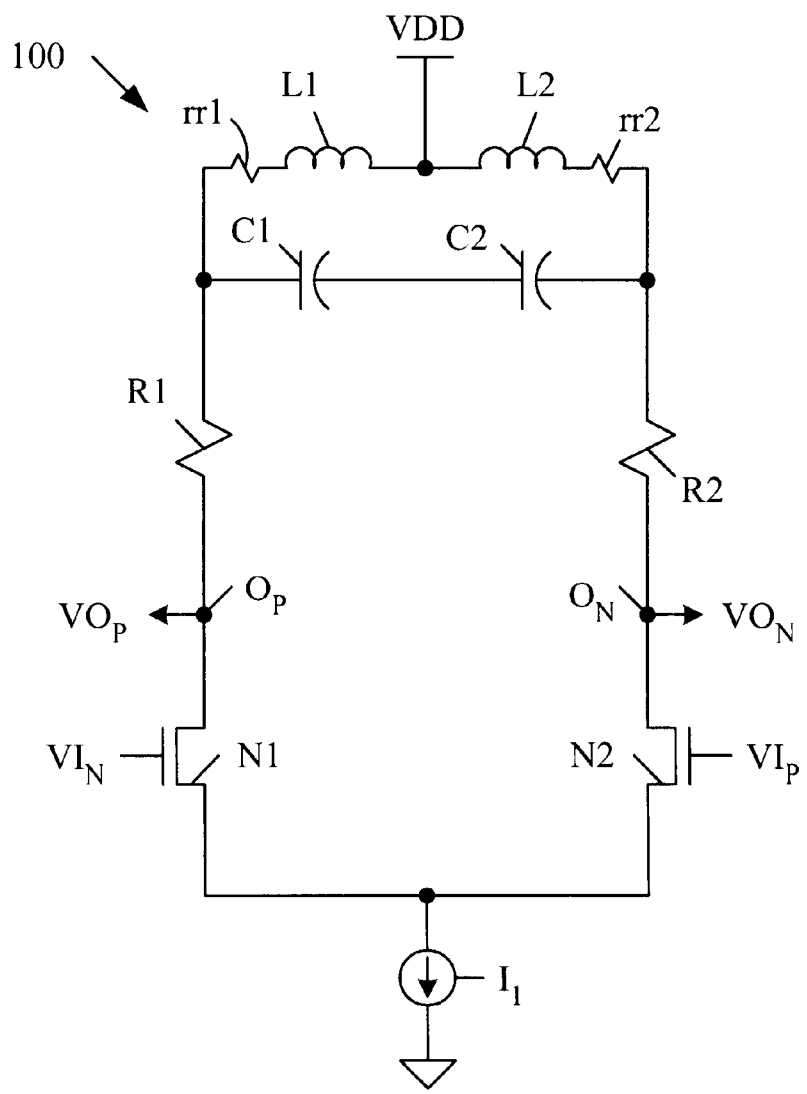
FIG. 1 is a circuit diagram of a conventional inductive amplifier circuit.
Figure 3:
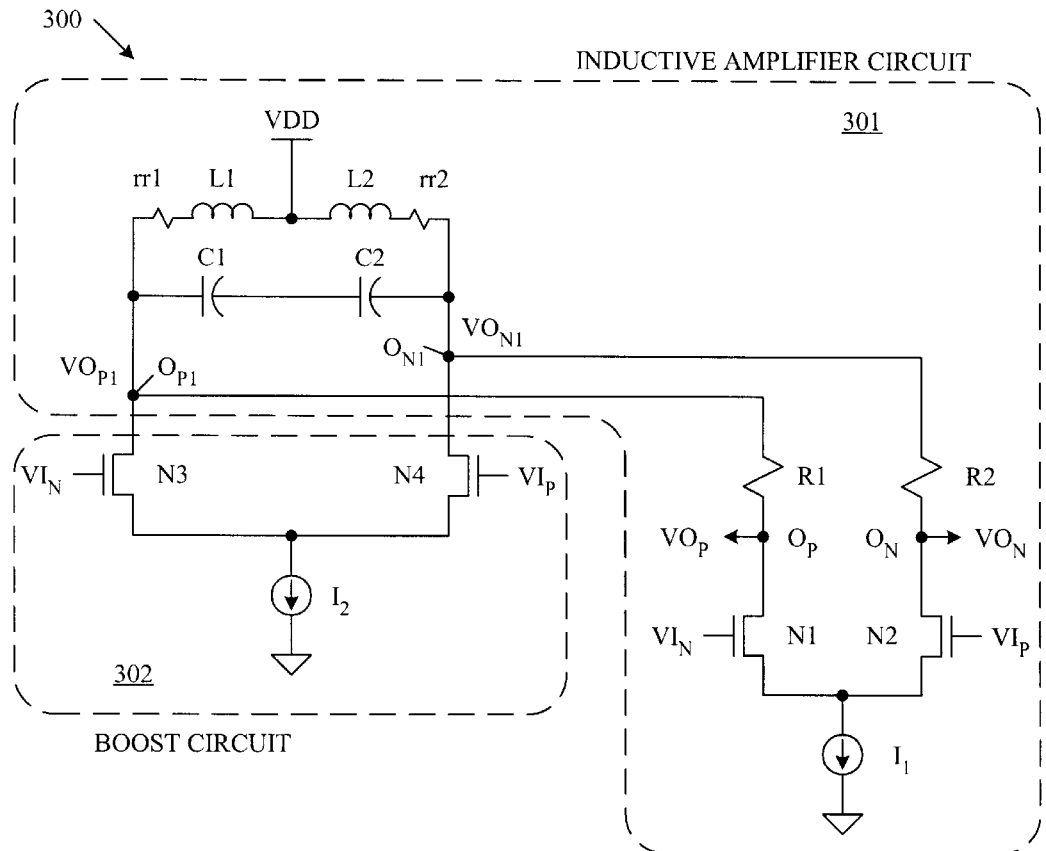
FIG. 3 is a circuit diagram of an inductive amplifier having feed-forward control in accordance with one embodiment of the present invention.

FIG. 3 is a circuit diagram of an inductive amplifier 300 having feed-forward control in accordance with one embodiment of the present invention. Inductive amplifier 300 may operate as an analog front end in a semiconductor chip. Inductive amplifier 300 includes an inductive amplifier circuit (or first stage) 301 and a feed-forward boost circuit 302. Inductive amplifier circuit 301 is configured in a manner similar to inductive amplifier 100 (FIG. 1). Thus, inductive amplifier circuit 301 includes inductors L1–L2, optional resistances rr1–rr2 (which may be parasitic resistances or resistors), capacitors C1–C2, resistors R1–R2, n-channel transistors N1–N2, current source $I_1$, and output nodes $O_N$ and $O_P$. It is understood that the values of these elements may differ between FIGS. 1 and 3. Inductive amplifier circuit 301 also includes intermediate output nodes $O_{P1}$ and $O_{N1}$ Voltages $VO_{P1}$ and $VO_{N1}$ are present on intermediate nodes $O_{P1}$ and $O_{N1}$ respectively.

The configuration of inductive amplifier circuit 301 will now be described briefly. Inductor L1 and resistance rr1 are connected in series between the $V_{DD}$ supply voltage terminal and the intermediate output node $O_{P1}$. Similarly, inductor L2 and resistance rr2 are connected in series between the $V_{DD}$ supply voltage terminal and the intermediate output node $O_{N1}$. Capacitors C1 and C2 are connected in series between intermediate output nodes $O_{P1}$ and $O_{N1}$. Load resistors R1 and R2 are connected between intermediate output nodes $O_{P1}$ and $O_{N1}$ respectively, and output nodes $O_P$ and $O_N$, respectively. Transistors N1 and N2 are connected between output nodes $O_P$ and $O_N$, respectively, and current source $I_1$. Current source $I_1$ provides a constant current ($I_1$) to ground.

Feed-forward boost circuit 302 includes n-channel boost transistors N3–N4 and boost current source $I_2$. Inductive amplifier circuit 301 and feed-forward boost circuit 302 are joined at intermediate output nodes $O_{P1}$ and $O_{N1}$. More specifically, transistors N3 and N4 are connected between nodes intermediate nodes $O_{P1}$ and $O_{N1}$ respectively, and boost current source $I_2$. Boost current source $I_2$ provides a constant current ($I_2$) to ground.

A differential input signal $VI_N$–$VI_P$ is applied to the gates of transistors N1 and N2, respectively. The $VI_N$ and $VI_P$ signals represent the negative and positive phases of the differential input signal, respectively. In general, inductive amplifier 300 is located on a semiconductor chip, and the $VI_N$ and $VI_P$ signals are received from an external transmitter, on a pair of pads on the chip. The $VI_N$ and $VI_P$ signals are also applied to the gates of transistors N3 and N4, respectively.

As described below, inductive amplifier 300 operates to create boosted differential output signals $VO_P$ and $VO_N$ in response to the differential input signals $VI_N$ and $VI_P$. The signals generated by feed-forward boost circuit 302 are effectively added to the signals generated by inductive amplifier circuit 301 at intermediate nodes $O_{P1}$ and $O_{N1}$. As a result, the frequency response of feed-forward boost circuit 302 is effectively added (with some scale factor) to the frequency response of inductive amplifier circuit 301. As a result, inductive amplifier 300 exhibits a higher gain is at higher frequencies.

Figure 4A:
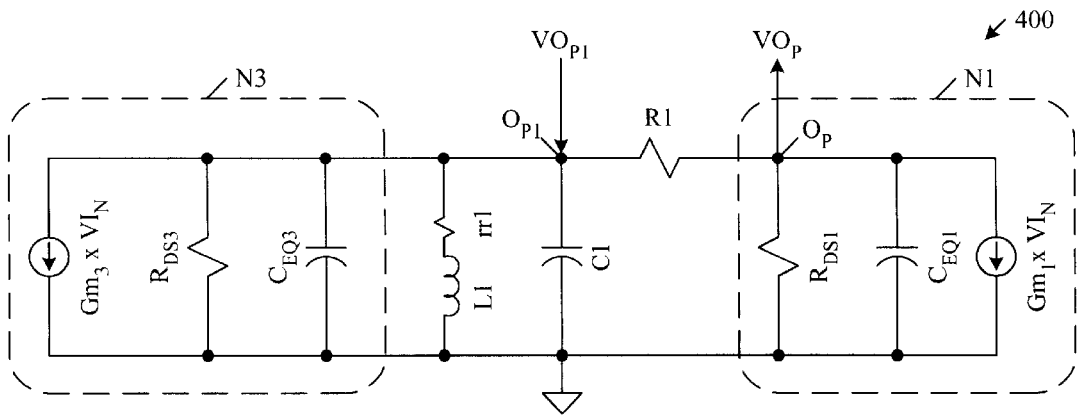
FIG. 4A is a half-circuit small signal model of the inductive amplifier of FIG. 3 in accordance with one embodiment of the present invention.

FIG. 4A is a half-circuit small signal representation 400 of inductive amplifier 300. This half-circuit 400 includes transistor N1, output node $O_P$, resistor R1, intermediate output node $O_{P1}$, transistor N3, capacitor C1, inductor L1 and resistance rr1. A similar half-circuit small signal representation could be provided for the other half of inductive amplifier 300. The illustrated half-circuit 400 shows transistor N1 as three parallel legs connected between output node $O_P$ and AC ground, including a small signal transistor current through transistor N1 ($gm_1 \times VI_N$), an equivalent capacitance of $C_{EQ1}$. and an equivalent channel resistance $R_{DS1}$. Note that $gm_1$ represents the transconductance of transistor N1, $C_{EQ1}$ represents the equivalent parasitic capacitance of transistor N1 plus any capacitive load (not shown) seen by output node $O_P$, and $R_{DS1}$ represents the drain-to-source resistance of transistor N1.

The illustrated half-circuit 400 also shows transistor N3 as three parallel legs, including a small signal transistor current through transistor N3 ($gm_3 \times VI_N$), an equivalent capacitance of $C_{EQ3}$, and an equivalent channel resistance $R_{DS3}$. Note that $gm_3$ represents the transconductance of transistor N3, $C_{EQ3}$ represents the equivalent parasitic capacitance of transistor N3, and $R_{DS3}$ represents the drain-to-source resistance of transistor N3. Capacitance $C_{EQ3}$. resistance $R_{DS3}$ and small signal transistor current ($gm_3 \times VI_N$) are connected in parallel between intermediate output node $O_{P1}$ and AC ground. Capacitor C1 is connected in parallel with the series-connected inductor L1 and resistance rr1 between intermediate output node $O_{P1}$ and AC ground. Resistor R1 is connected between output node $O_P$ and intermediate output node $O_{P1}$.

Figure 4B:
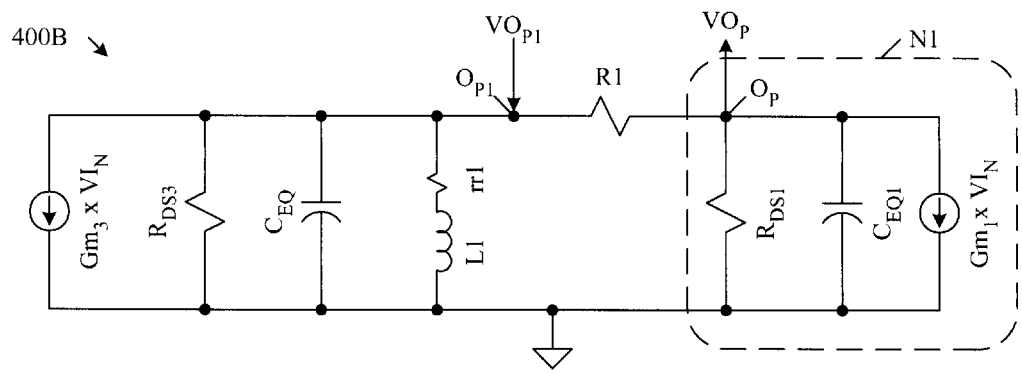
FIG. 4B is a half-circuit small signal model of the inductive amplifier of FIG. 3 in accordance with another embodiment of the present invention.

FIG. 4B is an equivalent half-circuit small signal representation 400B of inductive amplifier 300. As illustrated in FIG. 4B, capacitor C1 and equivalent capacitance $C_{EQ3}$ can be shown as a total equivalent capacitance $C_{EQ}$.

It is desirable for the transfer function of half-circuit 400 to have a high bandwidth, such that inductive amplifier 300 is able to operate at frequencies in the multi-gigahertz range.

The feed-forward impedance between intermediate output node $O_{P1}$ and AC ground (from left to right) includes L resistor R1 and transistor N1. This feed forward impedance is designated as Z, wherein Z is defined as follows. Note that in the following calculations, the small signal transistor currents ($gm_3 \times VI_n$) and ($gm_1 \times VI_N$) are assumed to have unit values equal to "1".

$$Z = R1 + \left[ \cfrac{1}{\cfrac{1}{R_{DS1}} + j\omega c_{EQ1}} \right] \quad (1)$$

The bracketed portion of equation (1), which is the parallel impedance of $R_{DS1}$ and $C_{EQ1}$, is defined as impedance $Z_O$.

The total impedance between intermediate output node $O_{P1}$ and AC ground is therefore equal to the impedance Z in parallel with capacitance $C_{EQ}$, resistance $R_{DS3}$, and the series combination of inductor L1 and resistance rr1. This total parallel impedance is designated as impedance A, and is defined as follows:

$$A = \cfrac{1}{\cfrac{1}{R_{DS3}} + \cfrac{1}{Z} + \cfrac{1}{rr1 + j\omega L1} + j\omega C_{EQ}} \quad (2)$$

The total transfer function of the feed-forward path is designated as transfer function H, and is defined as follows:

$$H = A \times Z_O / Z \quad (3)$$

The impedance between output node $O_P$ and AC ground (from right to left) includes resistor R1 in series with the parallel combination of capacitance $C_{EQ}$, resistance $R_{DS3}$, and the series combination of inductor L1 and resistance rr1. This impedance is designated as $Z_2$, wherein $Z_2$ is defined as a follows:

$$Z_2 = R1 + \left[ \cfrac{1}{\cfrac{1}{R_{DS3}} + \cfrac{1}{rr1 + j\omega L1} + j\omega C_{EQ}} \right] \quad (4)$$

The total impedance $Z_{TOT}$ as seen from the output node $O_P$ is therefore equal to the following:

$$Z_{TOT} = \left[ \cfrac{1}{\cfrac{1}{Z_2} + \cfrac{1}{R_{DS1}} + j\omega C_{EQ1}} \right] \quad (5)$$

Figure 5:
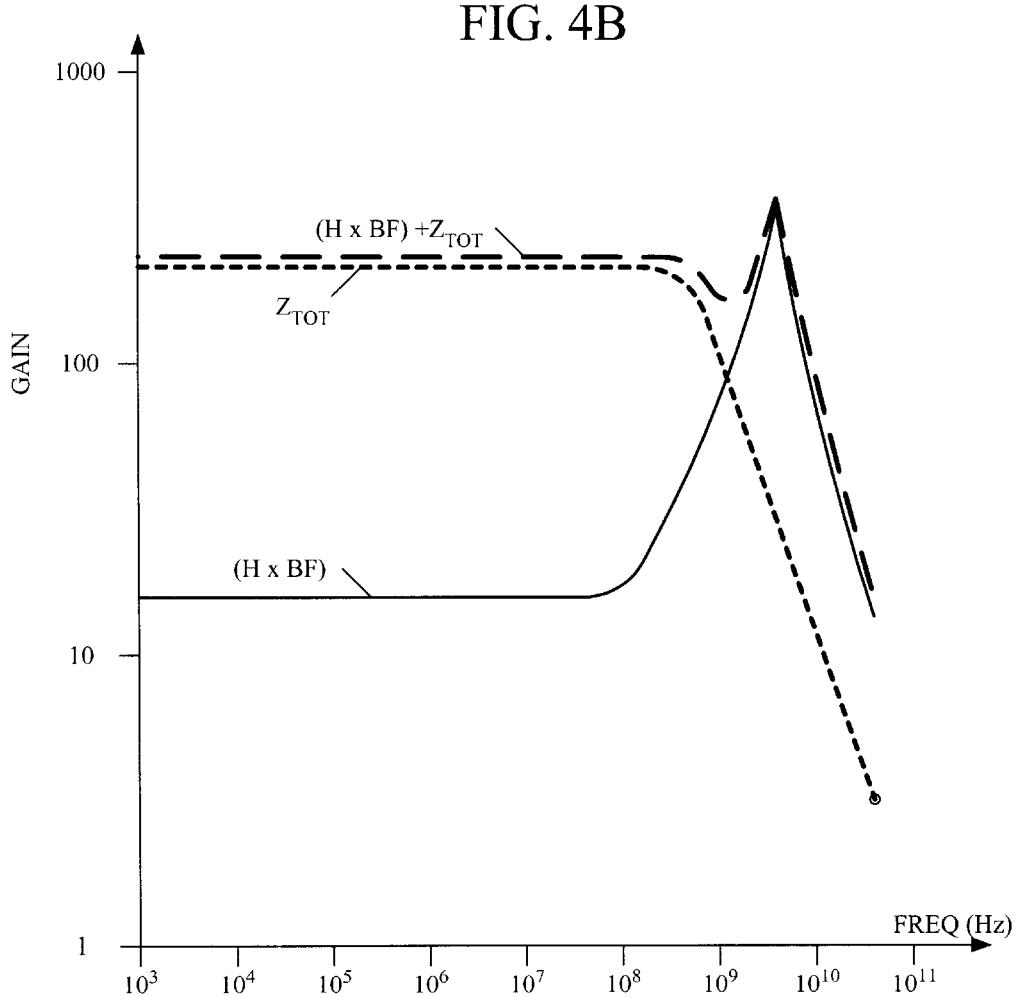
FIG. 5 is a Bode plot that illustrates frequency response curves of the inductive amplifier of FIG. 3 in accordance with one embodiment of the present invention.

FIG. 5 is a bode plot illustrating the frequency response of the feed-forward transfer function H, the total impedance $Z_{TOT}$ as seen from output node Op. and the sum of H and $Z_{TOT}$ in accordance with one embodiment of the present invention. In this embodiment, the feed-forward transfer function H is multiplied by a boost factor (BF), which is controllable by controlling the sizes of boost transistors N3 and N4 and/or the boost current source $I_2$.

Figure 2:
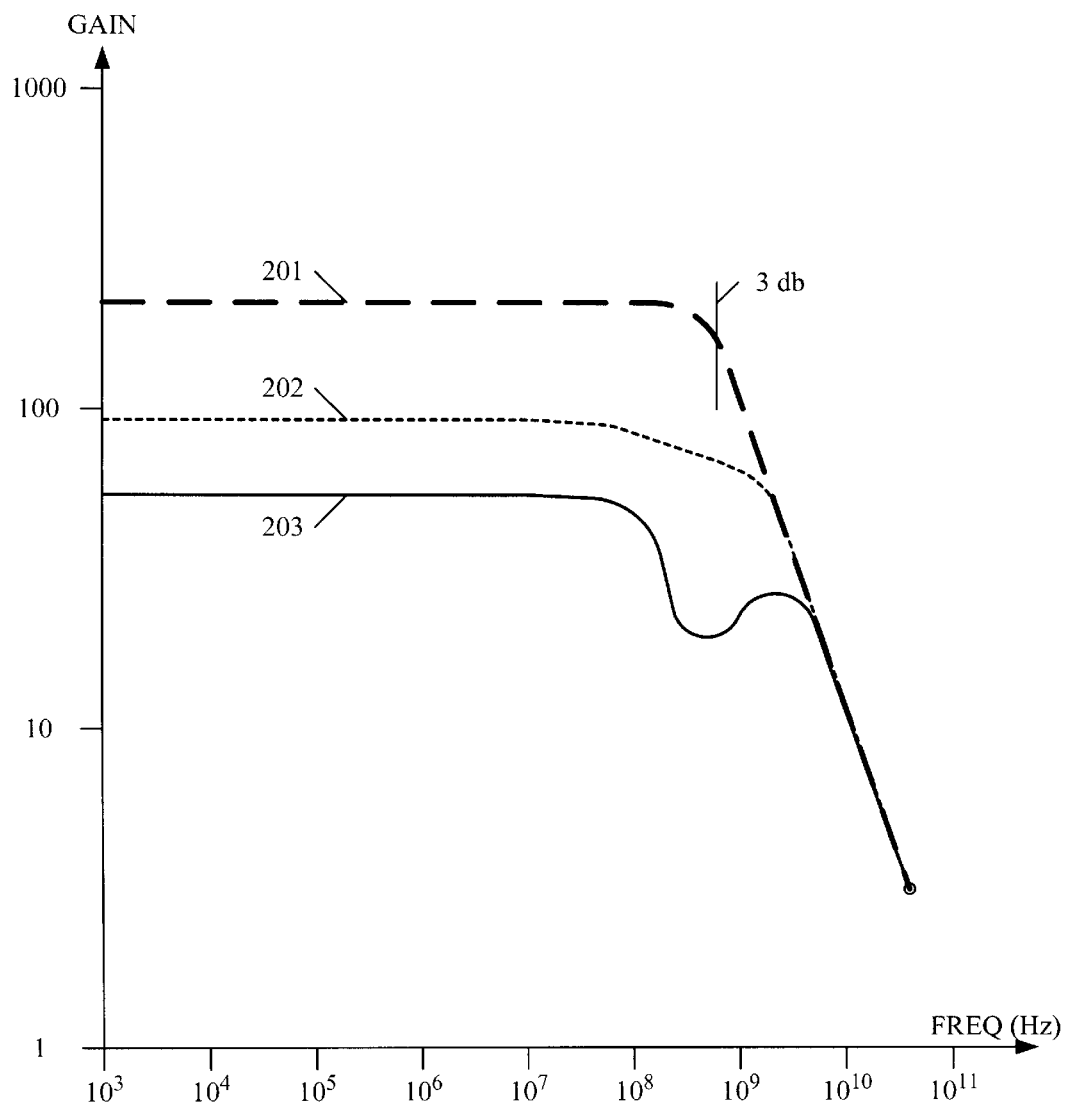
FIG. 2 is a Bode plot that illustrates various frequency response curves of the inductive amplifier circuit of FIG. 1.

Note that curve for the total impedance $Z_{TOT}$ is similar to curve 201 illustrated in FIG. 2 above. The gain of the $Z_{TOT}$ curve remains relatively constant from DC (0 Hz) to just greater than $10^8$ Hz. At frequencies greater than $10^8$ Hz, the gain of the $Z_{TOT}$ curve drops off sharply.

Also note that the curve for the feed-forward transfer function (H×BF) has a constant relatively low gain from DC (0 Hz) to about $10^8$ Hz. At frequencies greater than $10^8$ Hz, the gain of the feed-forward transfer function (H×BF) increases sharply, and peaks at a frequency of about $3 \times 10^9$ Hz. At frequencies greater than $3 \times 10^9$ Hz, the gain of the feed-forward transfer function drops off sharply.

Amplifier circuit 300 is configured such that the curve of the feed-forward transfer function (H×BF) is added to the curve of the total impedance $Z_{TOT}$, thereby providing a combined gain curve (H×BF)+$Z_{TOT}$. Thus, as illustrated in FIG. 5, the combined gain curve maintains an acceptable gain for frequencies up to about $10^{10}$ Hz.

In other embodiments, amplifier circuit 300 can be configured to exhibit $Z_{TOT}$ curves similar to curves 202 and 203 in FIG. 2. In such embodiments, amplifier circuit 300 will exhibit a DC gain at lower frequencies, and a higher gain at higher frequencies.

As illustrated in FIG. 5, boost circuit 302 inserts extra current into the $O_{P1}$ and $O_{N1}$ output nodes to boost the output signals $VO_P$ and $VO_N$. Thus, the output signals $V_{OP1}$ and $V_{OP1}$ are boosted without requiring negative feedback. As a result, inductive amplifier 300 is able to operate at higher frequencies than the prior art inductive amplifier 100.

Figure 6:
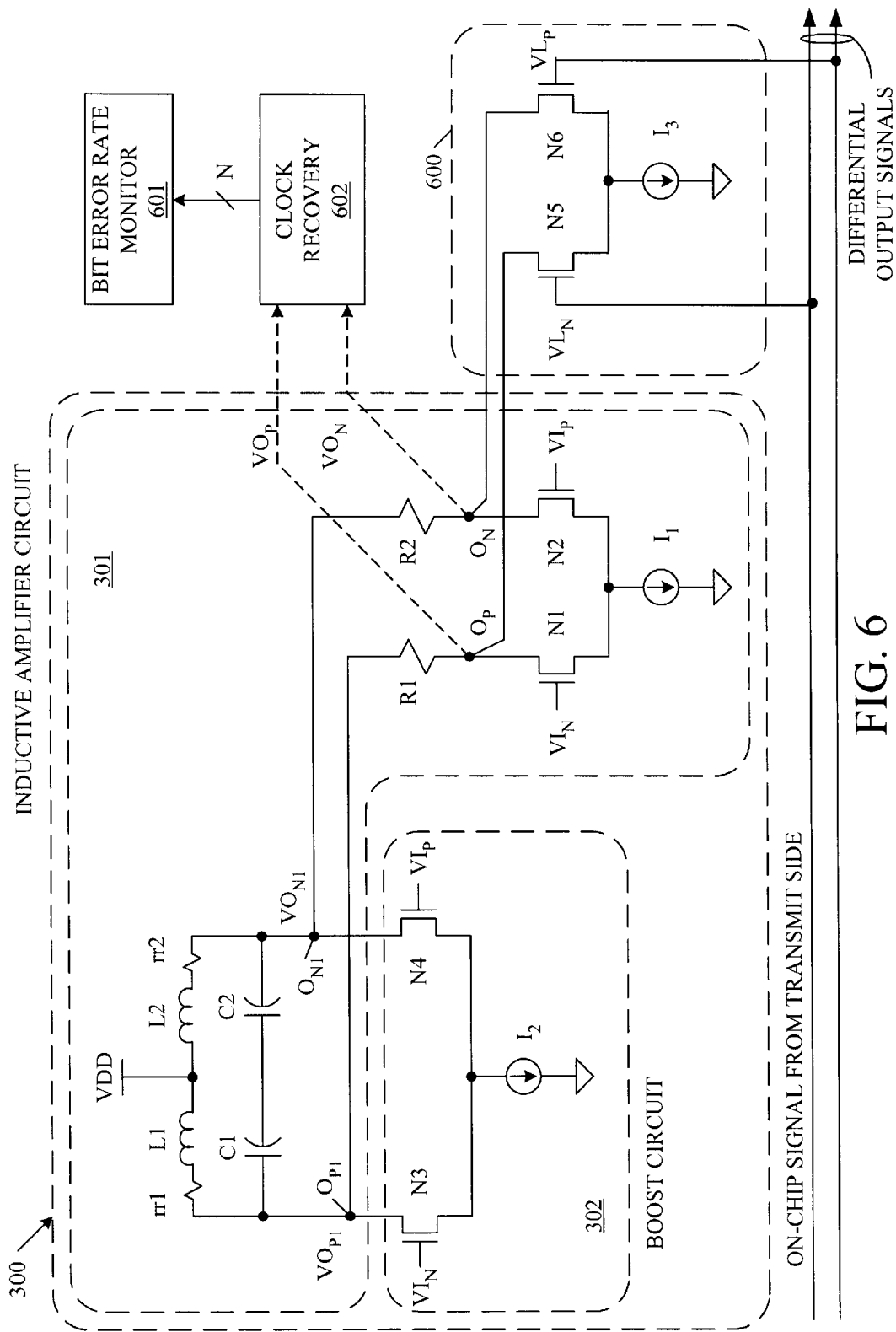
FIG. 6 is a circuit diagram illustrating an inductive amplifier that includes a loop-back circuit in accordance with an alternate embodiment of the present invention.

Inductive amplifier 300 can also be modified to provide on-chip loop back of transmission data. FIG. 6 is a circuit diagram illustrating an inductive amplifier circuit 600, which includes the inductive amplifier 300 of FIG. 3, plus an additional loop-back circuit 600.

Loop-back circuit 600 includes n-channel loop-back transistors N5–N6 and loop-back current source $I_3$. Loop-back circuit 600 is coupled to clock recovery circuit 602 and bit error rate monitor 601, which are located on-chip. During normal operation (as described above), loop-back current source $I_3$ is disabled, such that current $I_3$ is equal to zero. As a result, inductive amplifier 300 operates in the manner described above.

During loop-back operation, current sources $I_1$ and $I_2$ are disabled, such that these currents are equal to zero. A transmitter circuit (not shown) provides differential output signals, which are routed off of the chip. These differential output signals are also provided to the gates of loop-back transistors N5 and N6 as loop-back voltages $VL_N$ and $VL_P$, before these signals are transmitted off chip. Loop-back current source $I_3$ is enabled, such that loop-back circuit 600, resistors R1–R2, capacitors C1–C2, inductors L1–L2 and resistances rr1–rr2 are configured to form an inductive amplifier circuit. As a result, the differential output signals applied to transistors N5 and N6 cause output signals $VO_P$ and $VO_N$ to be developed on nodes $O_P$ and $O_N$. The output signals $VO_P$ and $VO_N$ are connected to clock recovery circuit 602, which recovers the clock signal from the $VO_P$ and $VO_N$ signals. Clock recovery circuit 602 then generates a plurality of digital signals, representative of the $VO_P$ and $VO_N$ signals, which are provided to bit error rate monitor 601. In response, bit error rate monitor 601 calculates the bit error rate of the recovered signals.

Although the invention has been described in connection with several embodiments, it is understood that this invention is not limited to the embodiments disclosed, but is capable of various modifications, which would be apparent to a person skilled in the art. For example, the feed-forward boost circuit of the present invention can be applied to any inductive amplifier. Moreover, the feed forward boost circuit can be used to increase the gain of an inductive amplifier at other frequencies. Thus, the invention is limited only by the following claims.

What is claimed is:

1. An inductive amplifier comprising:
   an inductive amplifier circuit having intermediate output nodes;
   a feed-forward boost circuit coupled to the intermediate output nodes of the inductive amplifier circuit; and
   a loop-back circuit coupled to the inductive amplifier circuit, the loop-back circuit being configured to route data to an error detection circuit through a clock recovery circuit.

2. The inductive amplifier of claim 1, wherein the loop-back circuit includes:
   a loop-back current source;
   a first loop-back transistor coupled between a first output node of the inductive amplifier circuit and the loop-back current source; and
   a second loop-back transistor coupled between a second output node of the inductive amplifier circuit and the loop-back current source.

3. A method of boosting the gain of an inductive amplifier circuit, the method comprising:
   generating a pair of primary currents in the inductive amplifier circuit in response to a pair of differential input signals;
   generating a pair of feed-forward currents in response to the pair of differential input signals;
   combining the primary currents with the feed-forward currents, whereby the feed-forward currents boost the gain of the inductive amplifier circuit; and
   performing a loop-back operation which comprises:
      transmitting a pair of differential output signals to a destination;
      routing the pair of differential output signals to a loop-back circuit coupled to the inductive amplifier circuit; and
      controlling the inductive amplifier in response to the pair of differential output signals, whereby the inductive amplifier generates a pair of differential loop-back signals representative of the pair of differential output signals.

4. The method of claim 3, further comprising:
   routing the pair of differential loop-back signals to a clock recovery circuit;
   generating a plurality of digital signals representative of the pair of differential loop-back signals with the clock recovery circuit; and
   routing the plurality of digital signals to a bit error rate monitor.

* * * * *